(12) United States Patent
Isoyan (10) Patent No.: US 8,739,076 B2
(45) Date of Patent: May 27, 2014

(54) METHOD AND APPARATUS FOR PROCESS WINDOW MODELING

(75) Inventor: Artak Isoyan, Beaverton, OR (US)

(73) Assignee: Synopsys, Inc., Mountain View, CA (US)

( * ) Notice: Subject to any disclaimer, the term of this patent is extended or adjusted under 35 U.S.C. 154(b) by 0 days.

(21) Appl. No.: 13/610,390

(22) Filed: Sep. 11, 2012

(65) Prior Publication Data

US 2014/0075398 A1    Mar. 13, 2014

(51) Int. Cl.
*G06F 17/50*    (2006.01)

(52) U.S. Cl.
USPC .................................. 716/51; 716/53; 716/54

(58) Field of Classification Search
USPC ............................................. 716/51, 53, 54
See application file for complete search history.

(56) References Cited

U.S. PATENT DOCUMENTS

| | | | | |
|---|---|---|---|---|
| 8,230,371 | B2* | 7/2012 | Borjon | 716/55 |
| 8,522,173 | B2* | 8/2013 | Heng et al. | 716/56 |
| 2004/0158808 | A1* | 8/2004 | Hansen | 716/21 |
| 2005/0081180 | A1* | 4/2005 | Kotani et al. | 716/21 |
| 2005/0188338 | A1* | 8/2005 | Kroyan et al. | 716/9 |
| 2005/0251771 | A1* | 11/2005 | Robles | 716/5 |
| 2006/0282814 | A1* | 12/2006 | Percin et al. | 716/21 |
| 2007/0006116 | A1* | 1/2007 | Percin et al. | 716/21 |
| 2008/0072207 | A1* | 3/2008 | Verma et al. | 716/21 |
| 2010/0293413 | A1* | 11/2010 | Borjon | 714/35 |

OTHER PUBLICATIONS

Isoyan A. et al., "Process window modeling using focus balancing technique," J. Vac. Sci. Technol. B 29(6), Nov./Dec. 2011, pp. 06F903-1 to 06F903-7.
Subbarao M., "On the Depth Information in the Point Spread Function of a Defocused Optical System," Tech. Report No. 90.02.07, Computer Vision Laboratory, Dept. of EE, State Univ. of NY, Stony Brook, NY, Feb. 1999, 15 pp.
Hopkins H.H., "On the Diffraction Theory of Optical Images," doi: 10.1098/rspa.1953.0071 Proc. R. Soc. Lond. A May 7, 1953 vol. 217 No. 1130 408-432.
Hopkins H.H., "The Concept of Partial Coherence in Optics," doi: 10.1098/rspa.1951.0158 Proc. R. Soc. Lond. A Aug. 22, 1951 vol. 208 No. 1093 263-277.

* cited by examiner

*Primary Examiner* — Jack Chiang
*Assistant Examiner* — Magid Dimyan
(74) *Attorney, Agent, or Firm* — Kenta Suzue; Haynes Beffel & Wolfeld LLP (57) ABSTRACT

A photolithographic modeling process is disclosed. Optical and non-optical parts of a model of the photolithographic process are calibrated. With the non-optical part of the model one or more model corrections are determined between (i) modeled critical dimension data from an aerial image generated by the optical part of the model, and (ii) empirical critical dimension data from tangible structures made at only a first process combination of a first dose and a first defocus in the photolithographic process. Critical dimension data of the photolithographic process are predicted at a second process combination of a second dose and a second defocus in the photolithographic process.

22 Claims, 9 Drawing Sheets

METHOD AND APPARATUS FOR PROCESS WINDOW MODELING

BACKGROUND

1. Field

The present technology relates to methods and apparatuses for improving optical proximity correction (OPC) model building, capable of extrapolation to any process condition within focus-exposure matrix (FEM), which can reduce the number of process combinations at which sample structures are made and empirically measured sample data are collected.

2. Description of Related Art

Conventional process window (PW) capable OPC models are calibrated at multiple process conditions (defocus and dose variations) across a focus-exposure matrix (FEM). However, such models cannot guarantee accurate prediction of new process conditions that are different from process conditions used in model calibration. The more process conditions that are included in the conventional OPC model calibration, the better the expected quality of the conventional process variation aware OPC model. However, multiple process conditions require additional wafer exposures and empirically measured data collection, and also increases the time needed to calibrate process variation aware OPC model.

With conventional process variation aware OPC model calibration, compact models are suited for predicting critical dimensions (CDs) only at the process condition(s) used in model calibration. When new process conditions vary from the process condition(s) used in model calibration, such models cannot guarantee correct prediction at the new process conditions (e.g., of the CDs at the new process conditions). Incomplete decoupling of the model's optical and resist effects disallows successful process window extrapolation beyond the process condition(s) used in model calibration.

Figure 1:
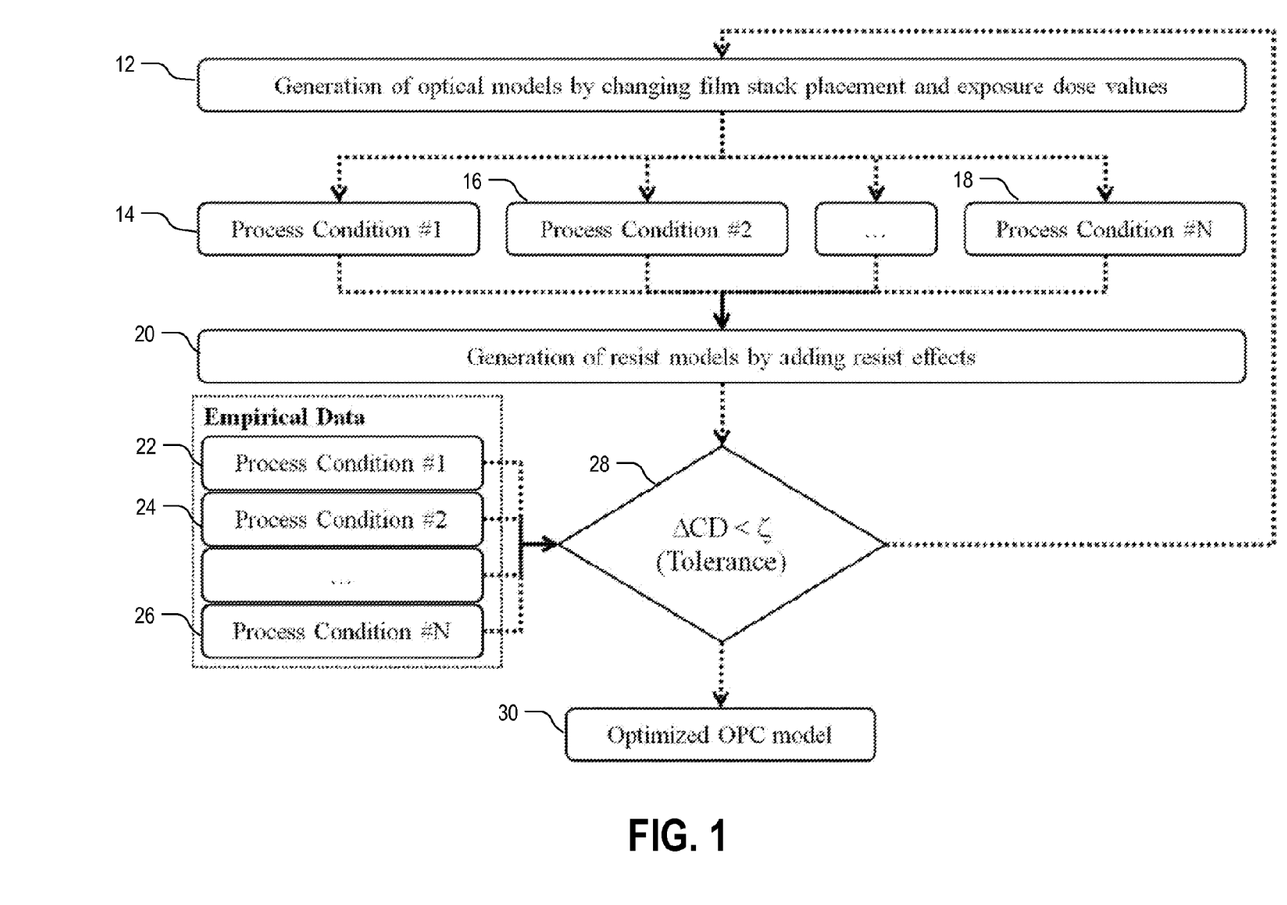
FIG. 1 is a schematic diagram of PW aware compact model-based model calibration using the conventional PW calibration flow.

FIG. 1 shows a conventional calibration flow. The OPC models consist of mask, optical, and resist components; and corresponding model parameters. An optical model is generated by changing film stack placement and exposure dose values 12. In calibration of the conventional OPC model, the model is calibrated at several process conditions 14 using a global optimization. A resist model is generated by adding resist effects 20. The model parameters are optimized during the model calibration process for the best possible match to sets of empirical data 22, 24, 26. Model calibration is performed until achieving an acceptable error tolerance of the modeled critical dimension 28. The result is the optimized OPC model 30.

However, the ability of the model to extrapolate to new process conditions other than those used for calibration, strictly depends on the number of process conditions included in model calibration. Also, significant time is required to calibrate such models, since the model calibration runtime is a linear function of the number of process conditions. Also, compact OPC models for 45 nm and smaller technology nodes have a large number of parameters that must be optimized during the model fitting process for the best possible match with the empirical data. Model calibration runtime has increased due to the complexity and increased number of model components and parameters to be optimized. Each process condition in the model calibration requires the collection of empirical data from exposed wafers made at the corresponding process condition, which leads to the additional requirement of collecting and analyzing significant quantities of process data. Also, hardware limits the number of process conditions used in a conventional PW OPC model calibration, since the physical computer memory usage is a linear function of the number of process conditions.

Traditional OPC models only compute the optimal pattern layout to optimize lithography patterning at the best process condition. An OPC model performs fast and reliable critical dimension (CD) prediction of all features present in the design layout. Accurate prediction of CD changes and lithographic effects under varying process conditions is beyond the scope of these mathematical models. OPC models that model only nominal process conditions are insufficient, due to inevitable process variation (such as defocus and dose variations) during production that place the post-OPC layout at a non-negligible patterning failure risk.

SUMMARY

In the disclosed technology, a photolithographic modeling process is disclosed. Optical and non-optical parts of a model of the photolithographic process are calibrated. With the non-optical part of the model one or more model corrections are determined between (i) modeled critical dimension data from an aerial image generated by the optical part of the model, and (ii) empirical critical dimension data from tangible structures made at only a first process combination of a first dose and a first defocus in the photolithographic process. Critical dimension data of the photolithographic process are predicted at a second process combination of a second dose and a second defocus in the photolithographic process.

One aspect of the technology is a computer-implemented method for modeling a photolithographic process. A process window capable optical proximity correction compact model is built, based on empirical data obtained from only a first process combination of a focus-exposure matrix of the photolithographic process. The process window capable optical proximity correction compact model is used to extrapolate process combinations different from the first process combination in the focus-exposure matrix.

One embodiment further comprises, building a non-optical part of the process window capable optical proximity correction compact model and an optical part of the process window capable optical proximity correction compact model. One embodiment further comprises, using at least the optical part of the process window capable optical proximity correction model and the non-optical of the process window capable optical proximity correction model, predicting critical dimension data of the photolithographic process at a second process combination of the focus-exposure matrix of the photolithographic process, wherein the second process combination and the first process combination are different in at least one of a dose and a defocus.

Another aspect of the technology is a computer-implemented method for modeling a photolithographic process is a method. An optical part of a model of the photolithographic process is calibrated, resulting in a calibrated optical part of the model.

A non-optical part of the model of the photolithographic process is calibrated with computer resources, by determining one or more model corrections between (i) modeled critical dimension data from an aerial image generated by the optical part of the model, and (ii) empirical critical dimension data from tangible structures made at only a first process combination of a first dose and a first defocus in the photolithographic process, resulting in a calibrated non-optical part of the model; and Using at least the calibrated optical part of the model and the calibrated non-optical of the model, critical dimension data of the photolithographic process are predicted at a second process combination of a second dose and a second defocus in the photolithographic process, the first process combination and the second process combination being different in at least one of a dose and a defocus.

In one embodiment, the one or more model corrections includes a dose shift in the non-optical part of the model of the photolithographic process.

In one embodiment, the one or more model corrections includes a defocus shift in the non-optical part of the model of the photolithographic process.

In one embodiment, calibrating the optical part of the model of the photolithographic process, results in decoupling the optical part of the model of the photolithographic process and the non-optical part of the model of the photolithographic process.

In one embodiment, adjustment of the defocus and the level in the resist stack, is sufficient to calibrate the optical part of the model.

In one embodiment, calibrating the optical part, includes adjusting (i) a defocus of the optical part of the model of the photolithographic process and (ii) a level in a resist stack on a wafer of the optical part of the model of the photolithographic process, to optimize a contrast value, the contrast value calculated at the level in the resist stack.

In one embodiment, the contrast value is optimized by maximizing the contrast value.

In one embodiment, calibrating the optical part is performed on one dimensional structures of the photolithographic pattern.

In one embodiment, calibrating the non-optical part is performed on one dimensional structures of the photolithographic pattern.

In one embodiment, two dimensional structures of the photolithographic pattern are excluded from calibrating the optical part, and included in predicting the critical dimension data.

In one embodiment, the non-optical part of the model includes at least one of a mask part of the model and a resist part of the model.

Other aspects are directed to a computer readable medium storing computer instructions to perform a method of designing an integrated circuit, the method for use by a computer system having a processor and memory. The computer instructions are executable by the computer system to design the integrated circuit as described herein.

Other aspects are directed to a computer system designing an integrated circuit, comprising a processor and memory, configured to model a photolithographic process as described herein.

DETAILED DESCRIPTION

The disclosed technology increases lithography process simulation robustness, and captures the optical lithography, mask, resist chemistry processes as well as process-window prediction.

Increasing the number of process conditions that are included in model calibration, results in more decoupling between the OPC model's optical and resist parts.

The disclosed technology relates to building a process window capable optical proximity correction compact model which requires empirical data at only one nominal process condition for model calibration. This compact model enables extrapolation to any other process condition(s) of a focus-exposure matrix. Optionally, empirical data at multiple nominal process conditions can be used for model calibration.

Focus and dose balancing techniques are used during model calibration. Model optimization is based on stepwise fitting with staged optimization of the OPC model components. Model components are added during the OPC model calibration starting with more physical components, such as mask and optics, followed by resist components. In each optimization stage, a component is optimized using global regression methods. The optimized parameters are regressed in a small range about their optimal values during subsequent model component optimization. This approach performs accurate correction, process window interpolation, and extrapolation. Quality of the calibrated model is assessed by comparison between prediction and measurement of verification patterns.

INTRODUCTION

As microelectronic feature sizes become smaller, lithographic processes are pushed closer to their theoretical limits. The modeling of such technologies requires more complex components to be included into the models of optical lithography simulations. As OPC calculations become increasingly complex, the allowed tolerable lithography PW becomes progressively smaller due to high numerical aperture (NA) and low k1 factor. The usable depth of focus (DOF) for the critical layer at the 45 nm technology node is 200 nm or less, which places tight requirements on process variation, wafer topography, and other possible sources of image quality degradation.

Predictable PW aware OPC enhances the robustness of post-OPC layout patterning in the presence of process condition variation. In some embodiments, the successful PW aware OPC model is an accurately calibrated model which is a continuous function of defocus and dose. In some embodiments, the PW aware OPC model can accurately describe lithographic effects not only for process conditions used during model calibration, but also can predict the correct model behavior for other process conditions.

Lithography process modeling creates an OPC model that transforms input design polygons into a wafer image. Optical proximity correction models are based on complex mathematical calculations of actual physical processes of optical lithography and resist exposure. Statistical methods can be used with the physical model component to enhance the OPC model for a better match with empirical data. The quality of the OPC model measures the quality of the model for proximity corrections.

Defocus and Dose Balanced PW Model Calibration

Calibration runtime of the process window aware OPC model varies with the number of process conditions and measurements used in the fitting process. Goals for shortening the calibration runtime, include building a PW OPC model at few process conditions of the focus-exposure matrix (such as a single process condition), and accurate prediction of the calibrated model PW behavior at other process conditions of the focus-exposure matrix. Additional data at various process conditions can be used as verification data for assessing the quality of the calibrated PW aware OPC model.

In some embodiments a set of empirical data at only a single process condition is required, although empirical data sets from multiple process conditions can be used. The process condition(s) used for model calibration can be at any location on the FEM matrix, as long as the measured empirical data include enough accurate metrology data for successful model optimization. In some embodiments, the model is completely decoupled into optical and resist parts. The model calibration flow is a staged optimization process with several main steps: aerial image contrast maximization, process condition offset adjustment, and optical and resist effects calibration.

Figure 2:
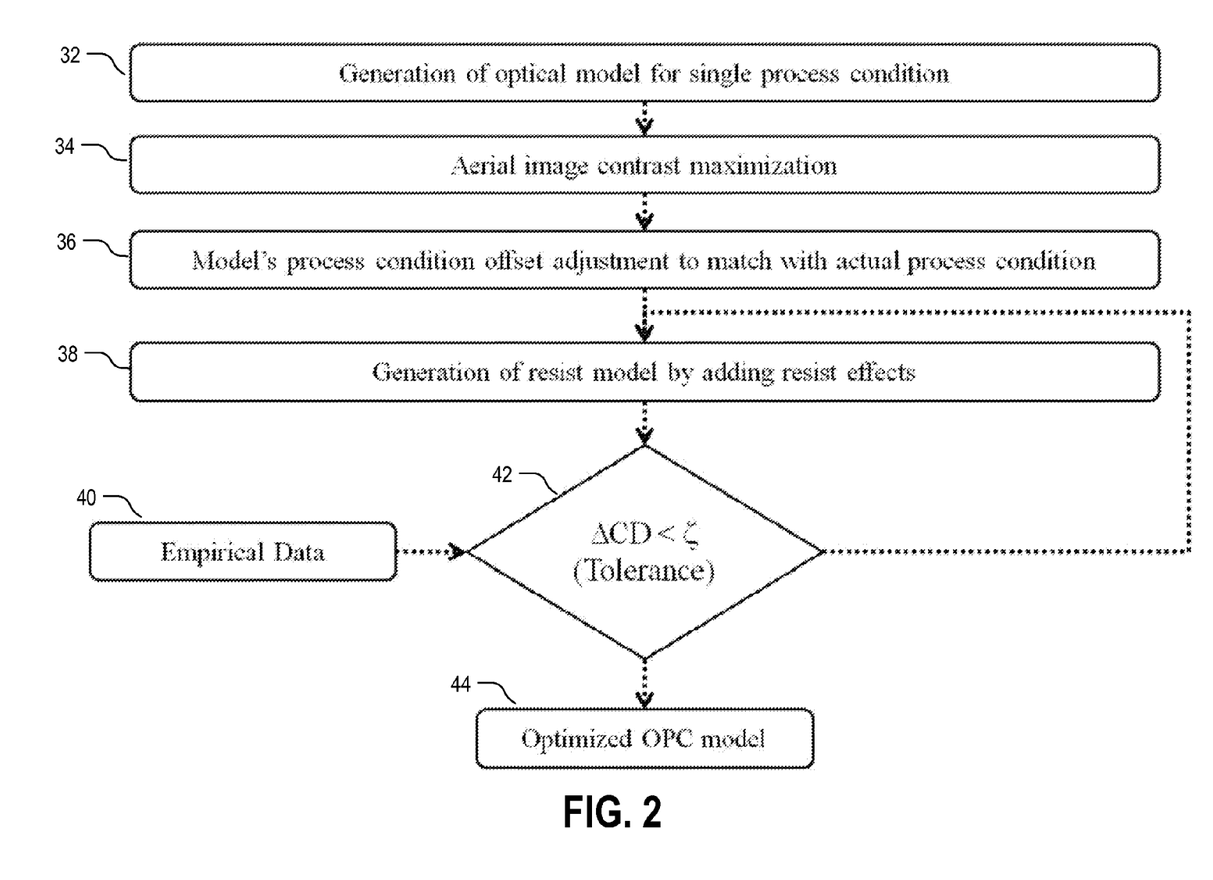
FIG. 2 is a schematic diagram of PW aware compact model-based model calibration using a focus and dose balanced PW model calibration flow.

FIG. 2 shows an example of PW aware compact model-based model calibration using a focus and dose balanced PW model calibration flow. In 32, an optical model is generated from a single process condition. In 34, aerial image contrast maximization is performed. In 36, the model's process condition undergoes an offset adjustment to match with the actual process condition. In 38, a resist model is generated by adding resist effects. The model parameters are optimized during the model calibration process for the best possible match to sets of empirical data 40. Model calibration is performed until achieving an acceptable error tolerance of the modeled critical dimension 42. The result is the optimized OPC model 44.

The model calibration flow starts from the generation of the OPC model capable of generating the aerial image. The model's aerial image is modeled by using the Hopkins equations, described at H. H. Hopkins, Philos. Trans. R. Soc. London, Ser. A 217, 408 (1953) and H. H. Hopkins, Philos. Trans. R. Soc. London, Ser. A 208, 263 (1951), all of which are incorporated by reference herein. The next step is to ensure that the model's optical system is focused. In other words, the system's delivered aerial image at the wafer plane has the highest contrast on given structures. Image modulation with the highest contrast allows the best printability of a given structure. The model's aerial image contrast/modulation is a function of the optical system's defocus (relative wafer location placement) and image depth (resist film stack placement) parameters.

In an optical stepper, the wafer is located at a distance from the stepper's objective lens, such as at a focal plane of the objective lens. The objective lens is the stepper lens which is closest to the wafer. The defocus is a parameter that describes the wafer's actual location relative to the focal plane location.

Wafers are coated with a resist stack of one or more material layers such as one or more photoresist layers, one or more antireflective layers to improve image printability, and one or more adhesion layers. Many OPC models are essentially two-dimensional models or functions of (x, y), with fixed vertical distance or fixed z-direction. Such models can be compact models or non-compact models. Image depth is the level inside the resist stack where the OPC model evaluates its calculations. The image depth parameter is limited by maximum height of the Resist stack. 0<=imagedepth<=ResistStackHeight.

The technique for aerial image optimization, called focus balancing, is a model optimization process. A combination of these parameters such as defocus and image depth parameters is found where the model's aerial image has the highest contrast. During physical manufacturing, the process condition where integrated circuit features have the best printability is called the nominal or best process condition. The model's process condition which delivers the highest aerial image modulation can be associated with the best process condition on the wafer. With this relationship, aerial image contrast maximization is used as an optimization step to match the process conditions between the model and the fabrication.

In some embodiments this technique is used on one-dimensional (1D) structures. In some embodiments two-dimensional (2D) structures can introduce degradation to the model's best process location.

For best printability of a given structure the aerial image contrast is a qualifying metric to find the optimized value for the defocus and image depth parameters.

The contrast, C, is determined as follows.

$$C = (I_{max} - I_{min})/(I_{max} + I_{min}), \text{ where } I \text{ is the aerial image intensity at a given location}$$

The contrast is calculated at a given distance below the top of the resist film stack placement and at a given defocus. The contrast calculation is repeated across various combinations of defocus and image depth. By maximizing the contrast on a 1D structure or on group of 1D structures, defocus and image depth parameters can be found where the delivered aerial image has maximum contrast. The optimized defocus and image depth combination ensures that the optical system is in perfect focus and hence corresponds to the best process condition of the FEM. For simplicity, the exposure dose is normalized. The focus balancing technique described above does not require any empirical data for the optical exposure system calibration.

Figure 3:
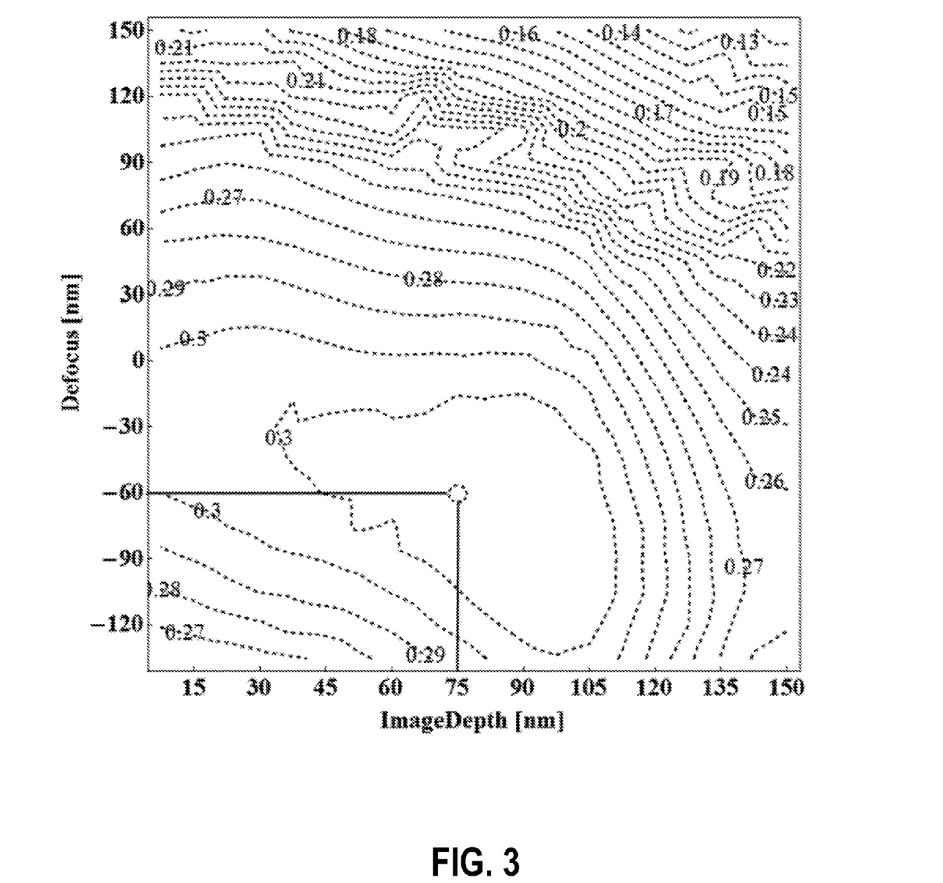
FIG. 3 is a graph of aerial image contrast contours vs. defocus and image depth parameters of the OPC model for 45 nm equal lines and spaces.
Figure 4:
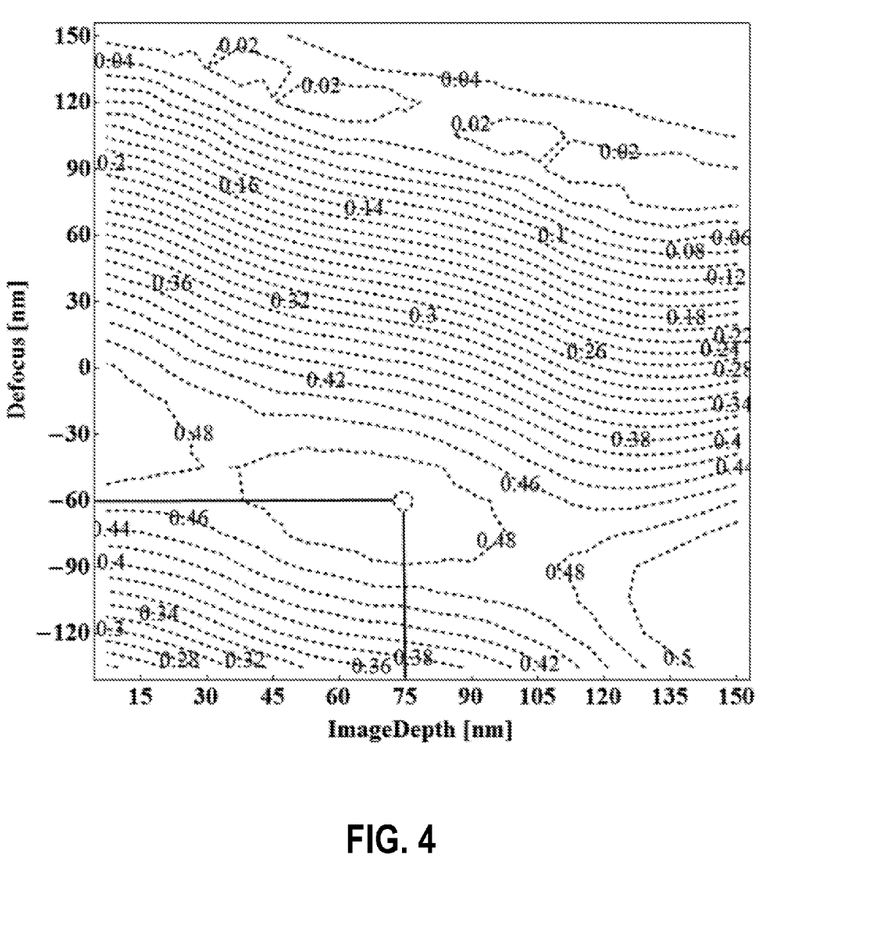
FIG. 4 is a graph of aerial image contrast contours vs defocus and image depth parameters of the OPC model for 65 nm equal lines and spaces.

A demonstration of focus balancing technique has been performed. FIGS. 3 and 4 show contour plots of aerial image contrast versus focus and image depth parameters for test structures consisting of equal lines and spaces (LS) with dimensions of 65 nm and 45 nm, respectively. The process setup is based on a binary mask exposure using 193 nm wavelength with a parameterized multipole source and NA of 1.2. The resist stack contains 95 nm of antireflective coating and 120 nm of resist in a liquid immersion system. Two different pitch structures have been used for contrast calculation. The resulting maximum contrast location is the same for both cases and corresponds to defocus of −60 nm and image depth of 75 nm below the top of the resist layer.

The OPC model's mask and resist components are optimized by empirical data. Such optimization relies on the quality of the measured data and also its location in the FEM matrix. After finding the OPC model's best defocus and image depth values, the next stage is to analyze the provided empirical data and make adjustments to the model's process condition (defocus and exposure dose) to match the actual data's process condition. In principle, the aerial image is a first order approximation to the final features produced by optical lithography. Thus, the optical only model is used directly to fit the empirical data before even applying the resist effects.

The process condition adjustment is done by running an optimization step on process offset parameters to minimize the model's fitting errors over the entire set of empirical data. In some embodiments, the measured empirical data contains line and space structures. The response to the dose and defocus change for line and space structures are opposite to each other, and are used for process condition adjustment. The output from this optimization stage is a process condition's exposure dose and defocus offsets, which shifts the model's process location to match with the process condition at which empirically measured sample data are collected.

Finally, during the last step of the model calibration flow, the resist effects are added to the calibrated optical model. In some embodiments, the model parameters responsible for the optics are locked and no longer optimized in this step. This ensures that the optical and resist effects of the model are completely decoupled. The model, which now includes the locked optical model and components necessary for modeling resist effects, is optimized over the entire set of empirical data.

Modeling and Results

Metrology

The experimental data set was acquired from an optical exposure system with a NA of 1.2, using a sector polarized annular illumination source with a wavelength of 193 nm, a $\sigma_{in}$ (inner radius) of 0.71 and $\sigma_{out}$ (outer radius) of 0.96. The background of the photomask is bright field, and the main features and sub-resolution assist features (SRAF) have a phase shift of 180 degrees and an intensity transmission of 6%. While the phase of the SRAFs remains the same as the main features, SRAFs have their own transmission, which is treated separately from main features during the modeling stage. The resist stack contains a bottom antireflective coating and resist layer with thicknesses of 95 nm and 120 nm, respectively. The empirical data used in the calculations consist of 597 one-dimensional (1D) and 920 two-dimensional (2D) structures, where 166 of 1D and 208 of 2D measurements taken at the best process exposure condition. The 1D features' sizes change from 40 to 112 nm and the pitches vary from 100 nm to 520 nm. The 2D features are mostly line ends. The data contain both line and space structures. The data's best process condition defocus is −10 nm and exposure dose is 28.2 mJ/cm$^2$. The data set includes seven process conditions listed in Table I below.

Modeling

Conventional and PW aware modeling methodologies have been exercised on a provided metrology data set. Three models have been optimized, from which the first two models (model A and model B) use conventional model optimization methodology and the last model (model C) uses the presented methodology. Model calibration is a fitting process to optimize model parameters for the best possible match to the empirical data. In the comparison of conventional and presented methodologies, the optimized models contain the exact same number of model components/parameters. Also, the models' calibrations use the same amount of computational resources. Descriptions of model components are given below.

The mask component defines the mask settings such as transmission, phase and nesting. Each of these settings is a parameter that is optimized during model calibration. The optical system of the lithography process is a well characterized model step. The extended source method predicts the aerial image of a projection system based on scalar and/or vector diffraction theory. The standard image model accounts for the important effect of image defocus through the resist film. The optical system aerial image is modeled with the Hopkins model. The overall aerial image intensity is the sum of the images produced by a certain number of coherent systems. The optical process settings/parameters usually are known, and can directly generate the aerial image. Nevertheless, in some cases these parameters undergo a slight optimization due to imperfection in extraction methods of these parameters. The resist component consists of several sub-components such as resist diffusion, pre- and post-exposure bake, and resist development. The constant threshold method has been applied to the model to extract the modeled CDs at measurement locations. The models parameters are optimized with a simulation engine to minimize the cost function over the entire model. The cost function is constructed from the root mean square (RMS) of the fitting errors ($\Delta CD = CD^{mod} - CD^{meas}$) and can be expressed as follows:

$$\text{Cost} = \text{RMS}_{All}(\text{RMS}_{1D} + \text{RMS}_{2D})$$

where $CD^{mod}$ and $CD^{meas}$ are the predicted and measured CDs at specific measurement locations. $\text{RMS}_{All}$ is the root mean square of fitting errors at all measurement locations. $\text{RMS}_{1D}$ and $\text{RMS}_{2D}$ are the root mean squares of 1D and 2D measurements, respectively.

The model A calibration was performed using conventional PW modeling technique on all seven process conditions in the provided test data (597 of 1D and 920 of 2D measurements). Models B and C have been optimized using conventional PW modeling and PW aware calibration methodology respectively on empirical data collected at nominal or the "best" process exposure condition (166 of 1D and 208 of 2D measurements). The leftover process conditions' data were used for assessing quality and process window predictability of models B and C.

Results

TABLE 1

| Process Conditions | | Model A (Conventional all process conditions) | Model B (Conventional nominal process condition only) | Model C (Focus&Dose Balanced nominal process condition only) |
|---|---|---|---|---|
| Dose [mJ/cm2] | Defocus [nm] | 1D + 2D RMS [nm] | 1D + 2D RMS [nm] | 1D + 2D RMS [nm] |
| 27.2 | −10 | 4.22 | 4.9 | 5.32 |
| 28.2 | −130 | 4.45 | 8.33 | 8.13 |
| 28.2 | −70 | 6.64 | 12.47 | 7.64 |
| 28.2 | −10 | 2.86 | 3.09 | 2.49 |
| 28.2 | 50 | 4.69 | 33 | 8.15 |
| 28.2 | 110 | 5.58 | 94 | 9.26 |
| 29.2 | −10 | 4.16 | 6.16 | 3.55 |
| Total calibration runtime | | ~24 hours | ~6 hours | ~7 hours |

Table I above lists a summary of the optimized model of RMS fitting errors for PW test data sets at various process conditions. The middle row in bold represents the nominal process condition, which is used for calibration of model B and C. In model A, all seven process conditions have been used in model calibration; hence no model extrapolation is done. In the cases of models B and C, the models have been extrapolated to the remaining six process conditions left for verification. The results show that all three models have comparable model behavior at the nominal process condition. This result was expected since the nominal process condition measured data has been used in model calibrations of all of the models. Model A shows good fitting results at all the process conditions, with the fitting error RMS varying from 2.84 nm to 6.64 nm. Model A can be considered well fit, since the RMS of fitting errors is within the measured metrology noise, typically in the range of 1-6 nm. On the other hand, model B, which has been calibrated with the same conventional flow as the model A, but with data from only one process condition, shows bad process window extrapolation. Model B's fitting error RMS dramatically changes when the model's process defocus or exposure dose is changed. As can be seen from Table I, even model B has a 3.09 nm RMS at the nominal process condition; it gets worse and reaches up to 94 nm RMS at a process exposure dose of 27.2 mJ/cm$^2$ and defocus of 110 nm. Thus, model B's process window fidelity is poor enough to potentially put the post-OPC layout at non-negligible patterning failure risk. Finally, model C shows good fitting results both at the nominal process condition (used in the model calibration) and at extrapolated process conditions. Unlike model B, model C has similar process window predictability as model A. Moreover, Model C's fitting error RMS of 2.49 nm at the nominal process condition is the smallest. In addition the to models' fitting errors, comparison of the model calibration runtimes shows that models B and C require approximately four times less calibration time than model A.

A further quality check of the models was conducted using the models PW predictability power by testing random locations of the test data. Several structures have been chosen to assess the models' process window extrapolation using Bossung plots.

Figure 5:
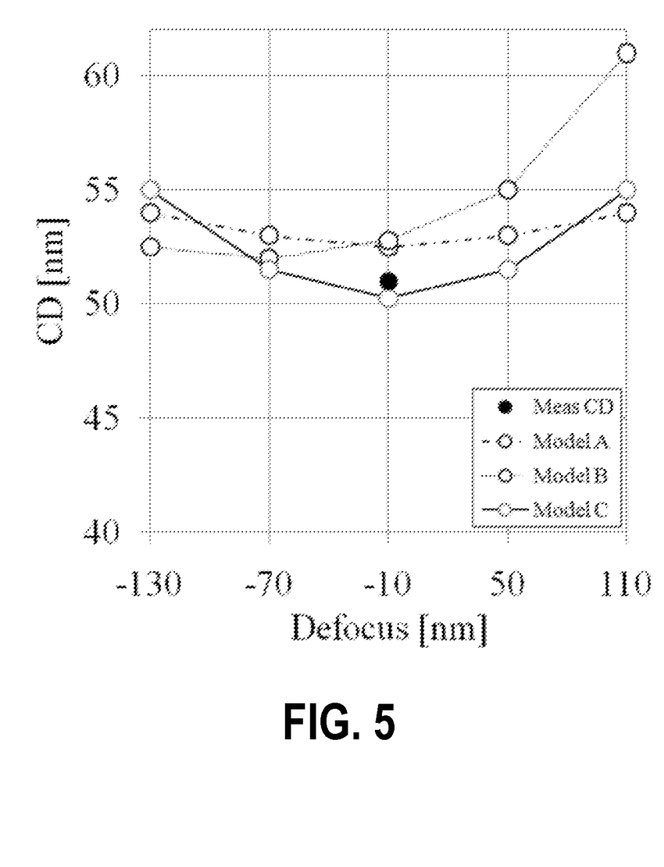
FIGS. 5-10 are Bossung plots at various process defocus and exposure doses.
Figure 7:
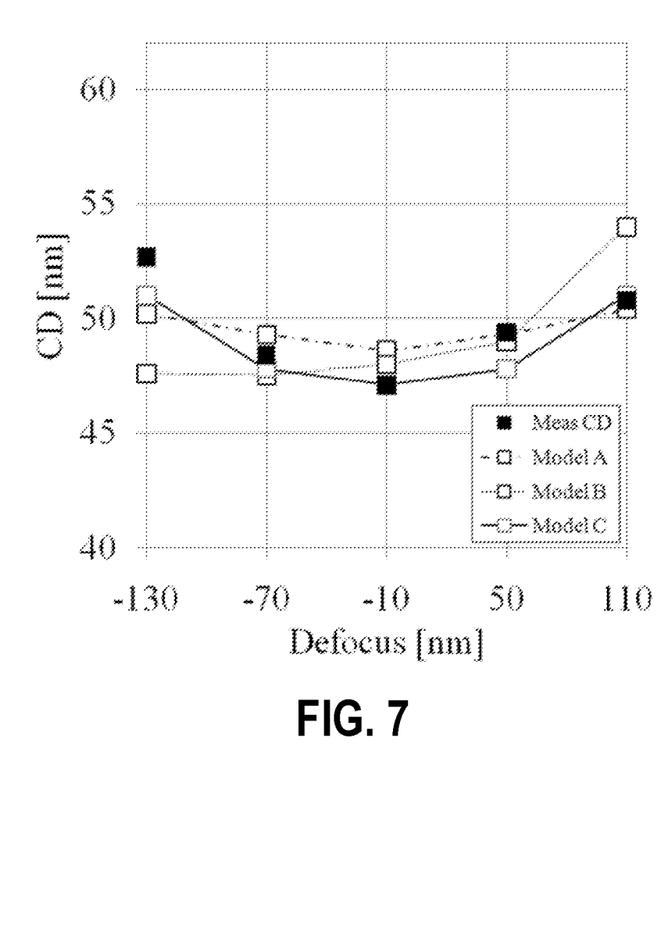
Figure 9:
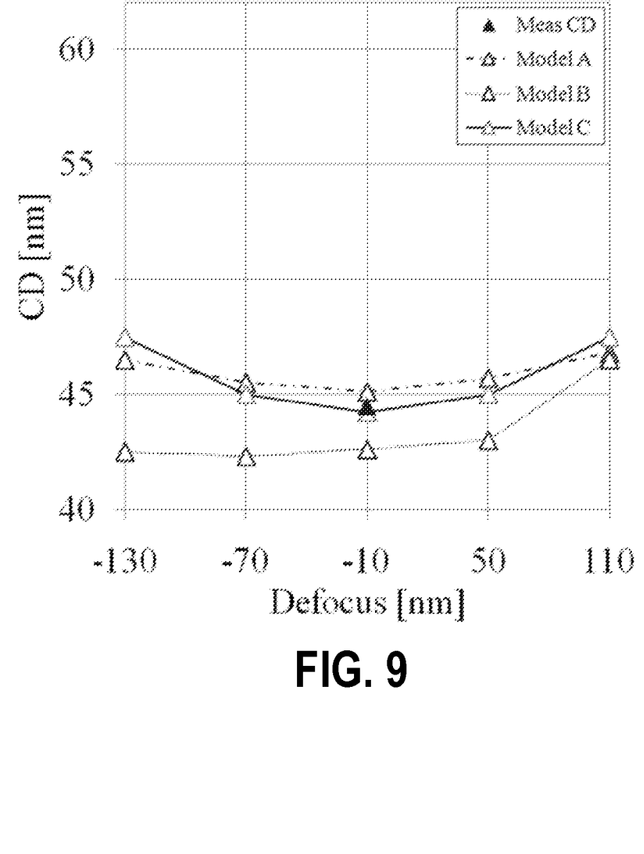

Bossung plots for 46.5 nm line and 53.5 nm space structures are shown at FIG. 5 (27.2 mJ/cm$^2$ exposure dose), FIG. 7 (28.2 mJ/cm$^2$ exposure dose), and FIG. 9 (29.2 mJ/cm$^2$ exposure dose).

Figure 6:
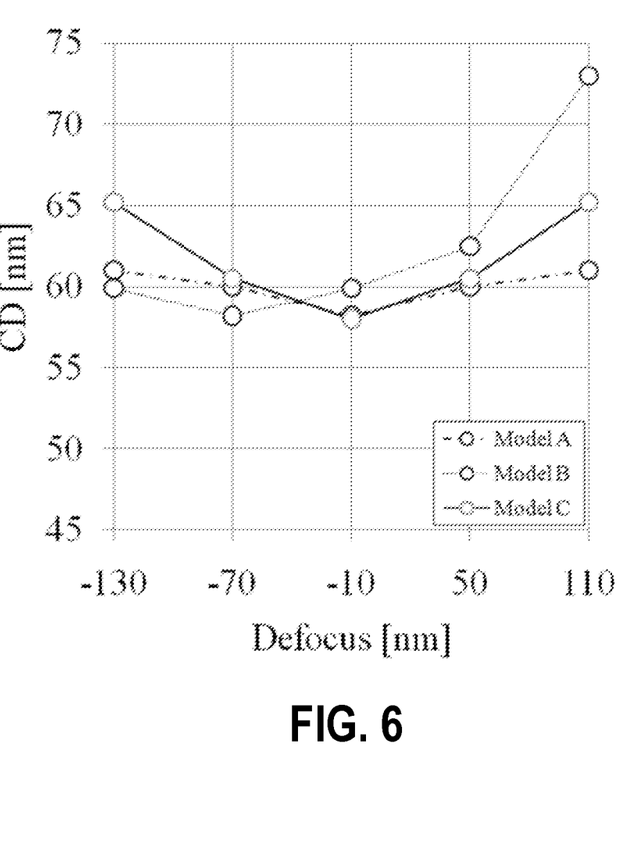
Figure 8:
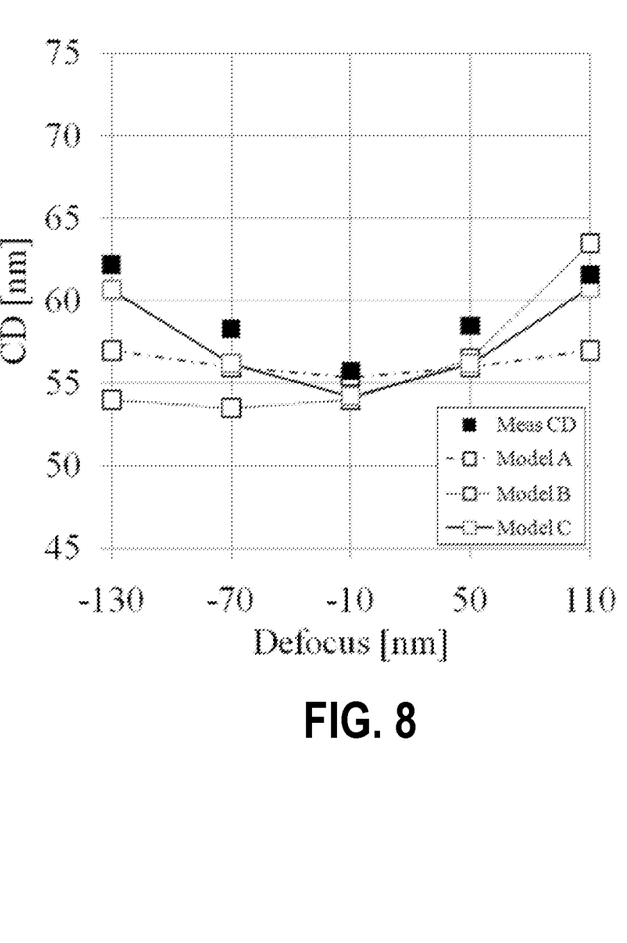
Figure 10:
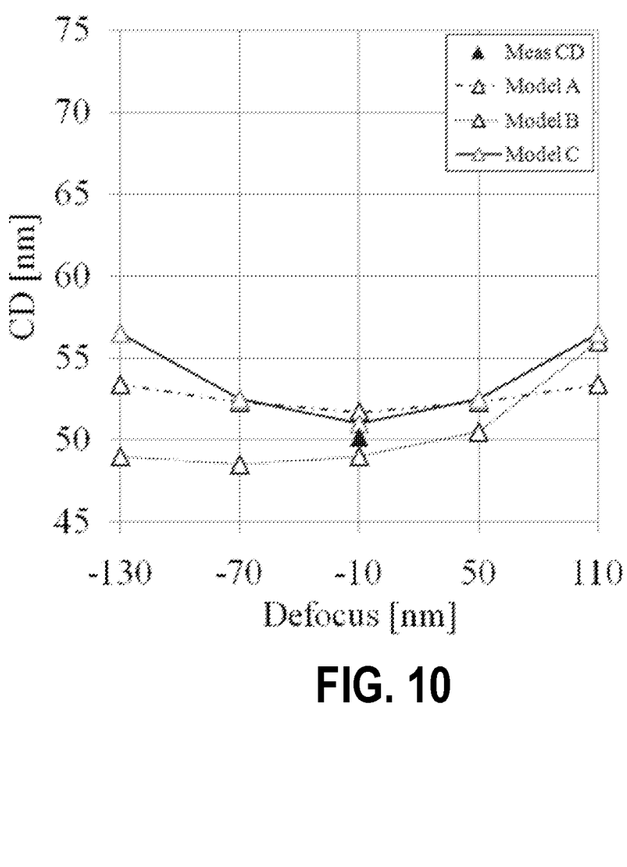

Bossung plots for 45 nm line and 55 nm space structures are shown at FIG. 6 (27.2 mJ/cm$^2$ exposure dose), FIG. 8 (28.2 mJ/cm$^2$ exposure dose), and FIG. 10 (29.2 mJ/cm$^2$ exposure dose).

As can be seen from the plots, models A and C demonstrate similar predictability for off dose and defocus conditions, while model B has asymmetric behavior when the defocus value is changed. The modeled CDs are shown at various process defocus and exposure doses. Model A is indicated by the dot dashed line, Model B is indicated by the dotted line, and Model C is indicated by the solid line.

Overall, in some embodiments the model statistics, stability, and process window predictability are comparable to conventional PW modeling (where all the process condition are used for model calibration), while the calibration time is significantly less (~4 times less for the data used in this work). This gives a good opportunity not only to calibrate good, predictable PW OPC models by spending less calculation runtime, but also reduces the amount of measurement data required for model calibration, since only the nominal condition data is required for the technique. This significantly reduces the time required for collecting such data.

In conclusion, a focus and dose balanced PW modeling approach is presented and tested on a 32 nm technology node process window test data set. Three model optimizations have been conducted, the first two using a conventional approach and the last one with the focus and dose balancing techniques. The results show that the modeled PW OPC model using the method requires less calibration runtime, since only a single process condition is required for model calibration. The PW modeling technique showed an improved RMS fitting error of the nominal process condition compared to the conventional approach. The fitting error RMS is well balanced across all the seven process conditions. The optimized PW OPC model enables good, predictable extrapolation and interpolation to any process condition within the available focus-exposure matrix. The calibrated PW OPC model is focus and dose balanced which significantly improves PW interpolation and extrapolation accuracy compared to conventionally optimized model using single process condition data only.

Figure 11:
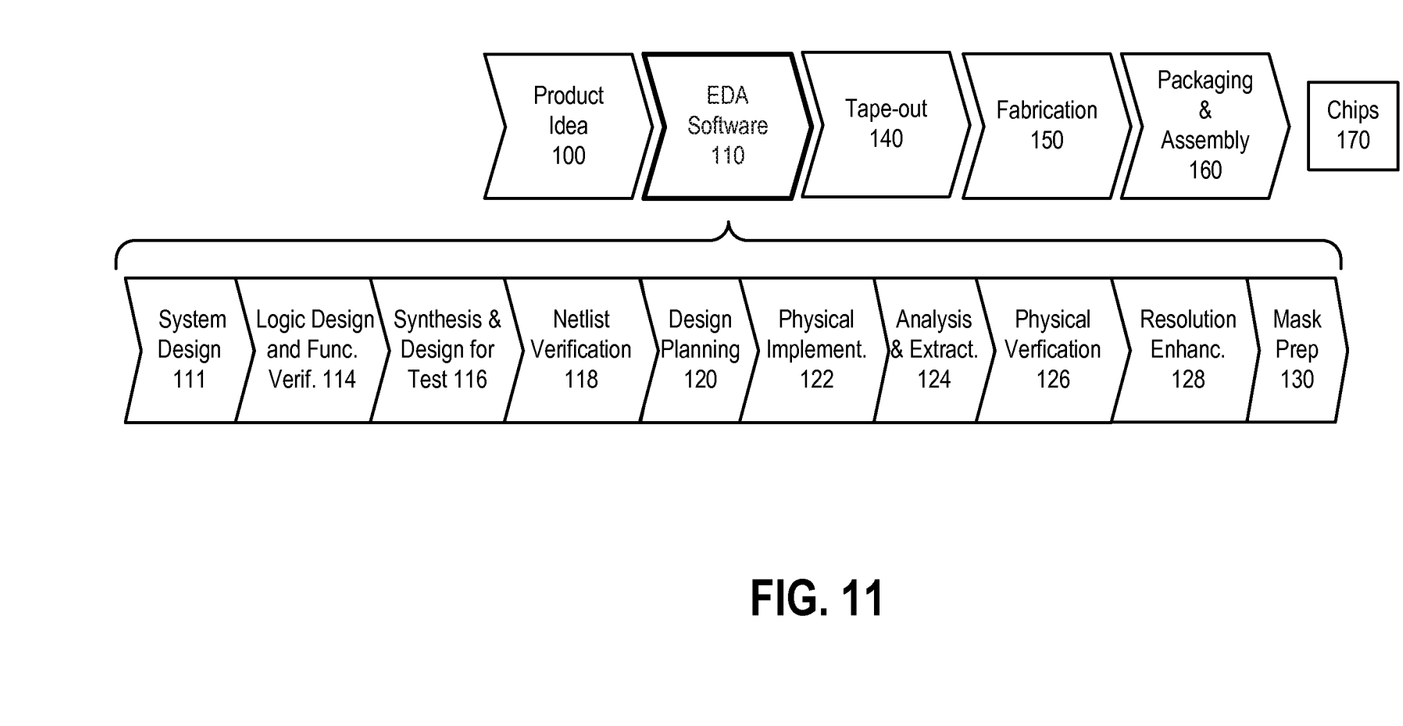
FIG. 11 shows a simplified representation of an illustrative integrated circuit design flow incorporating features of the technology.

FIG. 11 shows a simplified representation of an illustrative integrated circuit design flow incorporating features of the technology.

At a high level, the process starts with the product idea (step 100) and is realized in an EDA (Electronic Design Automation) software design process (step 110). When the design is finalized, it can be taped-out (step 140). After tape out, the fabrication process (step 150) and packaging and assembly processes (step 160) occur resulting, ultimately, in finished integrated circuit chips (result 170).

The EDA software design process (step 110) is actually composed of a number of steps 112-130, shown in linear fashion for simplicity. In an actual integrated circuit design process, the particular design might have to go back through steps until certain tests are passed. Similarly, in any actual design process, these steps may occur in different orders and combinations. This description is therefore provided by way of context and general explanation rather than as a specific, or recommended, design flow for a particular integrated circuit.

A brief description of the components steps of the EDA software design process (step 110) will now be provided.

System design (step 111): The designers describe the functionality that they want to implement, they can perform what-if planning to refine functionality, check costs, etc. Hardware-software architecture partitioning can occur at this stage. Example EDA software products from Synopsys, Inc. that can be used at this step include Model Architect, Saber, System Studio, and DesignWare® products.

Logic design and functional verification (step 114): At this stage, the VHDL or Verilog code for modules in the system is written and the design is checked for functional accuracy. More specifically, the design is checked to ensure that it produces the correct outputs in response to particular input stimuli. Example EDA software products from Synopsys, Inc. that can be used at this step include VCS, VERA, DesignWare®, Magellan, Formality, ESP and LEDA products.

Synthesis and design for test (step 116): Here, the VHDL/Verilog is translated to a netlist. The netlist can be optimized for the target technology. Additionally, the design and implementation of tests to permit checking of the finished chip occurs. Example EDA software products from Synopsys, Inc. that can be used at this step include Design Compiler®, IC Compiler, DFT Compiler, Power Compiler, FPGA Compiler, TetraMAX ATPG, and DesignWare® products.

Netlist verification (step 118): At this step, the netlist is checked for compliance with timing constraints and for correspondence with the VHDL/Verilog source code. Example EDA software products from Synopsys, Inc. that can be used at this step include Formality, PrimeTime, and VCS products.

Design planning (step 120): Here, an overall floor plan for the chip is constructed and analyzed for timing and top-level routing. Example EDA software products from Synopsys, Inc. that can be used at this step include Astro and IC Compiler products.

Physical implementation (step 122): The placement (positioning of circuit elements) and routing (connection of the same) occurs at this step. Example EDA software products from Synopsys, Inc. that can be used at this step include the Astro and IC Compiler products.

Analysis and extraction (step 124): At this step, the circuit function is verified at a transistor level, this in turn permits what-if refinement. Example EDA software products from Synopsys, Inc. that can be used at this step include AstroRail, PrimeRail, PrimeTime, and Star RC products.

Physical verification (step 126): At this step various checking functions are performed to ensure correctness for: manufacturing, electrical issues, lithographic issues, and circuitry.

Example EDA software products from Synopsys, Inc. that can be used at this step include the IC Validator product.

Resolution enhancement (step 128): This step involves geometric manipulations of the layout to improve manufacturability of the design. Example EDA software products from Synopsys, Inc. that can be used at this step include Proteus, ProteusAF, and PSMGen products.

Mask data preparation (step 130): This step provides the "tape-out" data for production of masks for lithographic use to produce finished chips. Example EDA software products from Synopsys, Inc. that can be used at this step include the CATS(R) family of products.

Figure 12:
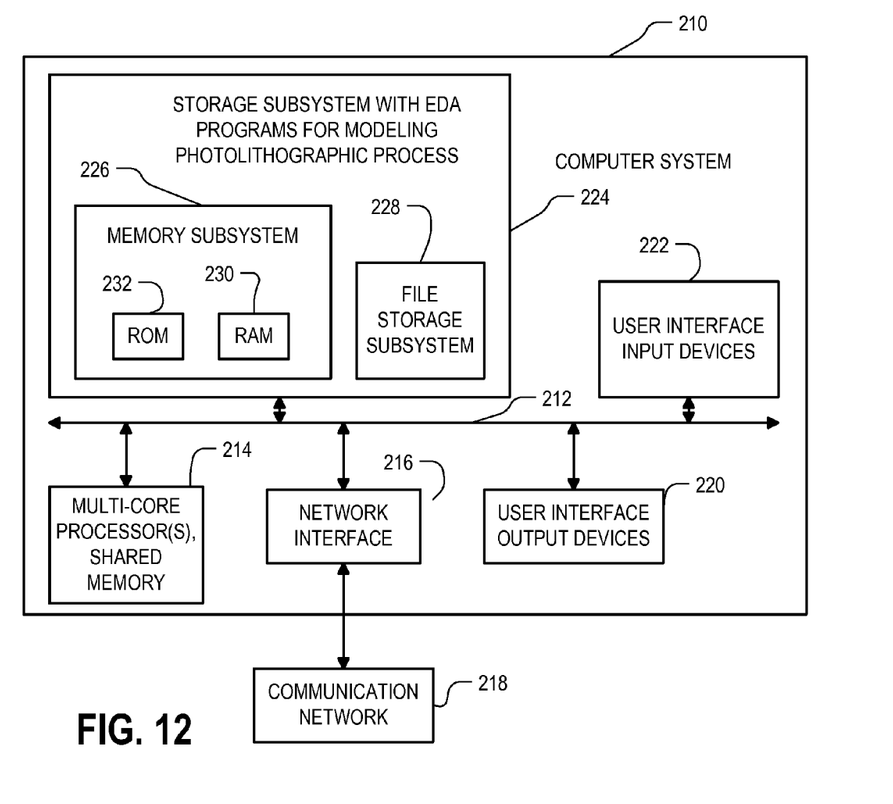
FIGS. 12 and 12A are simplified block diagrams of a computer system that can be used to implement software incorporating aspects of the technology.
Figure 12A:
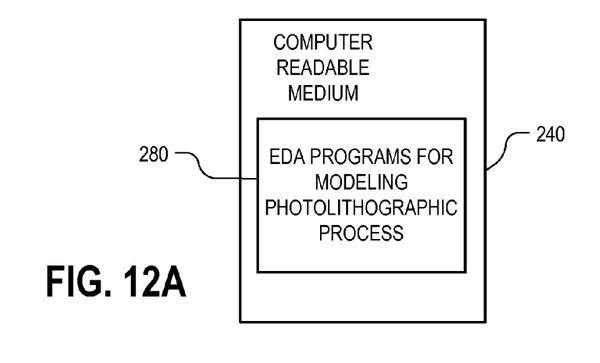

FIGS. 12 and 12A are simplified block diagrams of a computer system that can be used to implement software incorporating aspects of the technology.

Computer system 210 typically includes a processor subsystem 214 which communicates with a number of peripheral devices via bus subsystem 212. These peripheral devices may include a storage subsystem 224, comprising a memory subsystem 226 and a file storage subsystem 228, user interface input devices 222, user interface output devices 220, and a network interface subsystem 216. The input and output devices allow user interaction with computer system 210. Network interface subsystem 216 provides an interface to outside networks, including an interface to communication network 218, and is coupled via communication network 218 to corresponding interface devices in other computer systems. Communication network 218 may comprise many interconnected computer systems and communication links. These communication links may be wireline links, optical links, wireless links, or any other mechanisms for communication of information. While in one embodiment, communication network 218 is the Internet, in other embodiments, communication network 218 may be any suitable computer network.

The physical hardware component of network interfaces are sometimes referred to as network interface cards (NICs), although they need not be in the form of cards: for instance they could be in the form of integrated circuits (ICs) and connectors fitted directly onto a motherboard, or in the form of macrocells fabricated on a single integrated circuit chip with other components of the computer system.

User interface input devices 222 may include a keyboard, pointing devices such as a mouse, trackball, touchpad, or graphics tablet, a scanner, a touch screen incorporated into the display, audio input devices such as voice recognition systems, microphones, and other types of input devices. In general, use of the term "input device" is intended to include all possible types of devices and ways to input information into computer system 210 or onto computer network 218.

User interface output devices 220 may include a display subsystem, a printer, a fax machine, or non visual displays such as audio output devices. The display subsystem may include a cathode ray tube (CRT), a flat panel device such as a liquid crystal display (LCD), a projection device, or some other mechanism for creating a visible image. The user interface output devices may also provide non visual display such as via audio output devices. In general, use of the term "output device" is intended to include all possible types of devices and ways to output information from computer system 210 to the user or to another machine or computer system.

Storage subsystem 224 stores the basic programming and data constructs that provide the functionality of certain aspects of the present invention. For example, the various modules implementing the functionality of a circuit simulator and computer-implemented steps in the prior figures may be stored in storage subsystem 224. These software modules are generally executed by processor subsystem 214. The data constructs stored in the storage subsystem 224 also can include any technology files, macrocell libraries, layout files, and other databases mentioned herein. Note that in some embodiments, one or more of these can be stored elsewhere but accessibly to the computer system 210, for example via the communication network 218.

Memory subsystem 226 typically includes a number of memories including a main random access memory (RAM) 230 for storage of instructions and data during program execution and a read only memory (ROM) 232 in which fixed instructions are stored. File storage subsystem 228 provides persistent storage for program and data files, and may include a hard disk drive, a floppy disk drive along with associated removable media, a CD ROM drive, an optical drive, or removable media cartridges. The databases and modules implementing the functionality of certain embodiments of the invention may have been provided on a computer readable medium such as one or more CD-ROMs (or may have been communicated to the computer system 210 via the communication network 218), and may be stored by file storage subsystem 228. The host memory 226 contains, among other things, computer instructions which, when executed by the processor subsystem 214, cause the computer system to operate or perform functions as described herein. As used herein, processes and software that are said to run in or on "the host" or "the computer", execute on the processor subsystem 214 in response to computer instructions and data in the host memory subsystem 226 including any other local or remote storage for such instructions and data.

Bus subsystem 212 provides a mechanism for letting the various components and subsystems of computer system 210 communicate with each other as intended. Although bus subsystem 212 is shown schematically as a single bus, alternative embodiments of the bus subsystem may use multiple busses.

Computer system 210 itself can be of varying types including a personal computer, a portable computer, a workstation, a computer terminal, a network computer, a television, a mainframe, or any other data processing system or user device. Due to the ever changing nature of computers and networks, the description of computer system 210 depicted is intended only as a specific example for purposes of illustrating the preferred embodiments of the present invention. Many other configurations of computer system 210 are possible having more or fewer components than the computer system depicted.

FIG. 12A is a simplified block diagram of a nontransitory computer readable medium storing computer executable instructions that implement software incorporating aspects of the technology. Example software includes EDA software discussed herein.

While the present technology is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A computer-implemented method for modeling a photolithographic process, the method comprising:
using at least one computer processor, calibrating an optical part of a model of the photolithographic process, resulting in a calibrated optical part of the model;
using the at least one computer processor, calibrating a non-optical part of the model of the photolithographic process, by determining one or more model corrections between (i) modeled critical dimension data from an aerial image generated by the optical part of the model, and (ii) empirical critical dimension data from tangible structures made at only a first process combination of a first dose and a first defocus in the photolithographic process, resulting in a calibrated non-optical part of the model; and using the at least one computer processor, using at least the calibrated optical part of the model and the calibrated non-optical of the model, predicting critical dimension data of the photolithographic process at a second process combination of a second dose and a second defocus in the photolithographic process, the first process combination and the second process combination being different in at least one of a dose and a defocus.

2. The method of claim 1, wherein the one or more model corrections includes a dose shift in the non-optical part of the model of the photolithographic process.

3. The method of claim 1, wherein the one or more model corrections includes a defocus shift in the non-optical part of the model of the photolithographic process.

4. The method of claim 1, wherein said calibrating the optical part of the model of the photolithographic process, results in decoupling the optical part of the model of the photolithographic process and the non-optical part of the model of the photolithographic process.

5. The method of claim 1, wherein adjustment of the defocus and the level in a resist stack, is sufficient to calibrate the optical part of the model.

6. The method of claim 1, wherein said calibrating the optical part, includes adjusting (i) a defocus of the optical part of the model of the photolithographic process and (ii) a level in a resist stack on a wafer of the optical part of the model of the photolithographic process, to optimize a contrast value, the contrast value calculated at the level in the resist stack.

7. The method of claim 6, wherein the contrast value is optimized by maximizing the contrast value.

8. The method of claim 1, wherein said calibrating the optical part is performed on one dimensional structures of a photolithographic pattern in the photolithographic process.

9. The method of claim 1, wherein said calibrating the non-optical part is performed on one dimensional structures of a photolithographic pattern in the photolithographic process.

10. The method of claim 1, wherein two dimensional structures of a photolithographic pattern in the photolithographic process are excluded from calibrating the optical part, and included in said predicting the critical dimension data.

11. The method of claim 1, wherein the non-optical part of the model includes at least one of a mask part of the model and a resist part of the model.

12. A nontransitory computer readable medium comprising computer readable instructions executable by a computer to perform:
calibrating an optical part of a model of the photolithographic process, resulting in a calibrated optical part of the model;
calibrating a non-optical part of the model of the photolithographic process, by determining one or more model corrections between (i) modeled critical dimension data from an aerial image generated by the optical part of the model, and (ii) empirical critical dimension data from tangible structures made at only a first process combination of a first dose and a first defocus in the photolithographic process, resulting in a calibrated non-optical part of the model; and
using at least the calibrated optical part of the model and the calibrated non-optical of the model, predicting critical dimension data of the photolithographic process at a second process combination of a second dose and a second defocus in the photolithographic process, the first process combination and the second process combination being different in at least one of a dose and a defocus.

13. The computer readable medium of claim 12, wherein the one or more model corrections includes a dose shift in the non-optical part of the model of the photolithographic process.

14. The computer readable medium of claim 12, wherein the one or more model corrections includes a defocus shift in the non-optical part of the model of the photolithographic process.

15. The computer readable medium of claim 12, wherein said calibrating the non-optical part is performed on one dimensional structures of a photolithographic pattern in the photolithographic process.

16. The computer readable medium of claim 12, wherein the non-optical part of the model includes at least one of a mask part of the model and a resist part of the model.

17. A computer system, comprising:
a processor and memory, performing:
calibrating an optical part of a model of the photolithographic process, resulting in a calibrated optical part of the model;
calibrating a non-optical part of the model of the photolithographic process, by determining one or more model corrections between (i) modeled critical dimension data from an aerial image generated by the optical part of the model, and (ii) empirical critical dimension data from tangible structures made at only a first process combination of a first dose and a first defocus in the photolithographic process, resulting in a calibrated non-optical part of the model; and
using at least the calibrated optical part of the model and the calibrated non-optical of the model, predicting critical dimension data of the photolithographic process at a second process combination of a second dose and a second defocus in the photolithographic process, the first process combination and the second process combination being different in at least one of a dose and a defocus.

18. The system of claim 17, wherein the one or more model corrections includes a dose shift in the non-optical part of the model of the photolithographic process.

19. The system of claim 17, wherein the one or more model corrections includes a defocus shift in the non-optical part of the model of the photolithographic process.

20. The system of claim 17, wherein said calibrating the non-optical part is performed on one dimensional structures of a photolithographic pattern in the photolithographic process.

21. The system of claim 17, wherein the non-optical part of the model includes at least one of a mask part of the model and a resist part of the model.

22. A computer-implemented method for modeling a photolithographic process, the method comprising:
using at least one computer processor, providing an optical part of a model of the photolithographic process, wherein the optical part of the model is adapted for calibration resulting in a calibrated optical part of the model;
using the at least one computer processor, providing a non-optical part of the model of the photolithographic process, wherein the optical part of the model is adapted for determining one or more model corrections between (i) modeled critical dimension data from an aerial image generated by the optical part of the model, and (ii) empirical critical dimension data from tangible structures made at only a first process combination of a first dose and a first defocus in the photolithographic process, resulting in a calibrated non-optical part of the model, wherein at least the calibrated optical part of the model and the calibrated non-optical of the model are adapted for predicting critical dimension data of the photolithographic process at a second process combination of a second dose and a second defocus in the photolithographic process, the first process combination and the second process combination being different in at least one of a dose and a defocus.

* * * * *